United States Patent
Takahashi

(10) Patent No.: US 7,088,155 B2
(45) Date of Patent: Aug. 8, 2006

(54) CLOCK GENERATING CIRCUIT

(75) Inventor: Akira Takahashi, Tokyo (JP)

(73) Assignee: Mitsubishi Denki Kabushiki Kaisha, Tokyo (JP)

( * ) Notice: Subject to any disclaimer, the term of this patent is extended or adjusted under 35 U.S.C. 154(b) by 0 days.

(21) Appl. No.: 10/500,717

(22) PCT Filed: Jan. 16, 2002

(86) PCT No.: PCT/JP02/00233

§ 371 (c)(1),
(2), (4) Date: Jul. 6, 2004

(87) PCT Pub. No.: WO03/061129

PCT Pub. Date: Jul. 24, 2003

(65) Prior Publication Data

US 2005/0062505 A1 Mar. 24, 2005

(51) Int. Cl.
H04L 25/36 (2006.01)
(52) U.S. Cl. .................... 327/144; 327/156; 327/147
(58) Field of Classification Search ........ 327/144–148, 327/141, 156–158, 99
See application file for complete search history.

(56) References Cited

U.S. PATENT DOCUMENTS

| 5,748,569 A | * | 5/1998 | Teodorescu et al. | ........ 368/118 |
| 6,653,874 B1 | * | 11/2003 | Ishikawa | ................ 327/144 |
| 2002/0001359 A1 | | 1/2002 | Skierszkan et al. | |

FOREIGN PATENT DOCUMENTS

| JP | 4-113718 | 4/1992 |
| JP | 6-232739 | 8/1994 |
| JP | 8-18447 | 1/1996 |
| JP | 8-37459 | 2/1996 |
| JP | 10-290158 | 10/1998 |
| JP | 11-298460 | 10/1999 |
| JP | 2000-31952 | 1/2000 |
| JP | 2000-148281 | 5/2000 |
| JP | 2001-77690 | 3/2001 |
| JP | 2001-251182 | 9/2001 |

* cited by examiner

Primary Examiner—Dinh T. Le
(74) Attorney, Agent, or Firm—Oblon, Spivak, McClelland, Maier & Neustadt, P.C.

(57) ABSTRACT

In a clock generation circuit generating a clock that is synchronized with a reference signal, it is an object to provide stable clocks by controlling phase jitter in a generated clock upon change of the reference signal, eliminate a stable-state phase difference between the reference signal and the generated clock so that control is eliminated, and allow the clock generation circuit to be integrated. The clock generation circuit is configured with multiple stages of PLL circuits such that PLL circuits 2 are provided for reference signals 1, respectively, and one of outputs from the PLL circuits 2 is selected to be fed to a PLL circuit 5 provided in a next stage. The phase fluctuation of a signal inputted to the PLL circuit 5 upon change of the reference signal 1 is reduced to control the phase jitter of the generated clock 6, thus allowing high loop gain in both the PLL circuit 2 and the PLL circuit 5. Then, phase difference between the reference signal 1 and the generated clock 6 is eliminated to eliminate control involved, so that the clock generation circuit may be integrated.

10 Claims, 10 Drawing Sheets

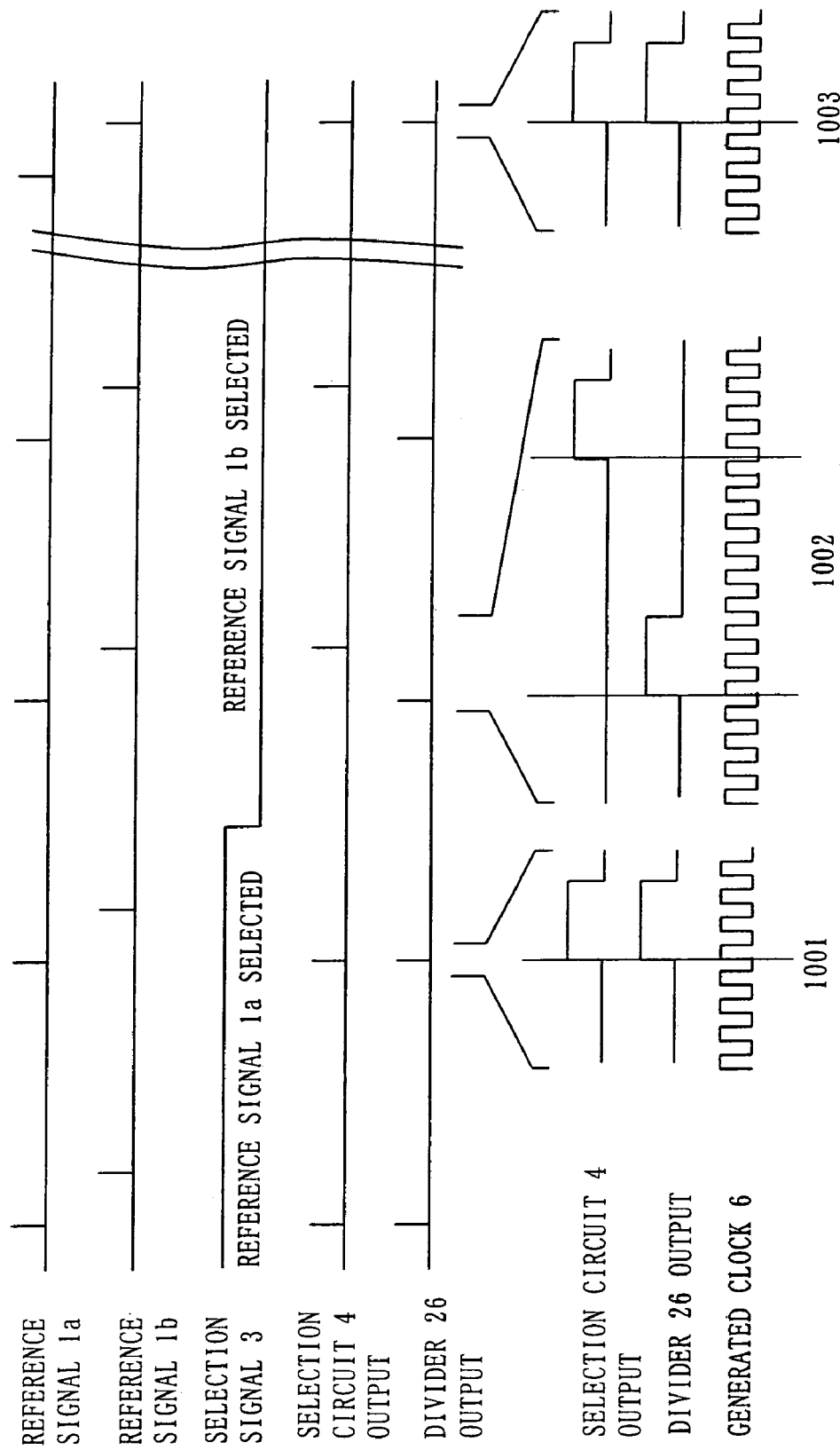

US 7,088,155 B2

CLOCK GENERATING CIRCUIT

TECHNICAL FIELD

This invention relates to a clock generation circuit, which generates a clock that is synchronized with a reference signal in a digital transmission system.

BACKGROUND ART

FIG. 9 is the block diagram of a conventional clock generation circuit as an example. With referring to the figure, a reference numeral 1 denotes a reference signal, a reference numeral 3 denotes a selection signal selecting one of a plurality of reference signals, a reference numeral 4 denotes a selection circuit, a reference numeral 5 denotes a PLL circuit, and a reference numeral 6 denotes a generated clock. The PLL circuit is configured with the following elements. A reference numeral 21 denotes a phase comparator, a reference numeral 22 denotes a low-pass filter, a reference numeral 23 denotes an amplifier, a reference numeral 24 denotes a reference voltage generator, a reference numeral 25 denotes a voltage control oscillator, and a reference numeral 26 denotes a divider.

The operation is now described. A plurality of reference signals 1 are inputted, and one of the plurality of reference signals is selected in the selection circuit 4 based on the selection signal 3. FIG. 9 shows the case of inputting two reference signals 1a and 1b for explanation. Then, the phase of a selected reference signal 1and the phase of a signal outputted from the divider 26 are compared in the phase comparator 21. The phase comparator 21 outputs a signal corresponding to a phase difference between the selected reference signal and the output signal from the divider 26. This phase difference signal is smoothed through the low-pass filter 22, and a voltage potential difference between this signal and the reference voltage generator 24 is amplified in the amplifier 23. The output voltage of the amplifier 23 activates the voltage control oscillator 25 to output the clock signal 6 whose phase is synchronized with the phase of the selected reference signal 1. The divider 26 divides the generated clock 6 to generate the signal whose phase is to be compared with the phase of the reference signal 1.

FIG. 10 shows the reference signals 1, an output from the selection circuit 4 that is selected based on the selection signal 3, the generated clock 6, and an output signal from the divider 26. At 1001 in FIG. 10, it is illustrated that a reference signal 1a is selected in the selection circuit 4 based on the selection signal 3, and the divider 26 and the generated clock 6 are both synchronized with the reference signal 1a.

With 1002 in FIG. 10, it is illustrated that a reference signal 1b is selected upon change of the selection in the selection circuit 4 based on the selection signal 3. In this state, the generated clock 6 and the output of the divider 26 are both out of phase with the reference signal 1b just selected. The phase comparator 21 outputs a phase difference signal in commensurate with this phase difference. The phase difference signal is then smoothed through the low-pass filter 22, and amplified through the amplifier 23 to control the transmission frequency of the voltage control oscillator 25 so that the phase of the output of the divider 26 and the phase of the reference signal 1b selected in the selection circuit 4 match.

At 1003 in FIG. 10, it is illustrated that the generated clock 6 and the output of the divider 26 are both synchronized with the reference signal 1b changed through the circuit operation mentioned above.

With the conventional circuit, it is needed to control the reference voltage generator 24 so as to match the phase of the selected reference signal 1 and the phase of the generated clock 6. In steady state, phase difference between the selected reference signal 1 and the generated clock 6 is called steady-state phase difference. The phase difference may be reduced by increasing the loop gain of the PLL circuit 5. However, the problem is that the transient phase fluctuation of the generated clock 6 gets large because it is affected by the change in phase of the reference signal 1 upon change of the reference signal 1. There is a tradeoff relation between the steady-state phase difference and the size of the phase fluctuation of the generated clock 6 upon change of the reference signal 1.

Further, it is hard to integrate the low-pass filter 22 for enhancing filter precision performance because the low-pass filter 22 is generally configured with such as a resistance and a capacitor. As the voltage control oscillator 25, there is VCXO (Voltage Controlled Xtal Oscillator) using crystal or VCO (Voltage Controlled Oscillator) using coils and capacitors. It is difficult to integrate VCXO. With VCO, its modulation sensitivity is so high that loop gain gets high in the PLL circuit. Therefore, the problem is that the phase fluctuation of the generated clock becomes large upon change of the reference signal.

The conventional clock generation circuit, thus configured, needs to control the reference voltage generator for matching the phase of the reference signal and the phase of the generated clock. And there is a problem that it is difficult to integrate the low-pass filter or the voltage control oscillator in the case of high precision control of the steady-state phase difference or the transient response upon change of the reference signal. Still another problem is that the transient response upon change of the reference signal depends upon loop gain in the PLL circuit and the time constant of the low-pass filter, so that high design flexibility cannot be achieved.

The present invention is directed to solving the problems discussed above. It is an object to eliminate control involved to match the phase of the reference signal and the phase of the generated clock, make it possible to integrate all the circuit elements, enable high precision transient response control upon change of the reference signal, and achieve high design flexibility.

DISCLOSURE OF THE INVENTION

A clock generation circuit according to the present invention selects one of a plurality of reference signals and generates a clock that is synchronized with a selected reference signal. The clock generation circuit is characterized by including, (1) a plurality of former stage PLL circuits respectively provided for each of the plurality of reference signals, generating outputs that are respectively synchronized with a corresponding reference signal, (2) a selection circuit selecting one of the outputs from the plurality of former stage PLL circuits, and (3) a latter stage PLL circuit linked in sequence to the plurality of former stage PLL circuits, for receiving the one of the outputs selected and generating the clock.

The clock generation circuit is characterized by further including a plurality of phase control circuits, respectively which is provided for each of the outputs from the plurality of former stage PLL circuits for matching phase of an output from another one of the plurality of former stage PLL circuits with the phase of an output from one of the plurality of former stage PLL circuits corresponding to the selected reference signal.

The phase control circuits are characterized by including a ring counter and a selection circuit selecting one of multiphase outputs from the ring counter.

The plurality of former stage PLL circuits is characterized by respectively performing synchronization in frequency with a corresponding reference signal, respectively.

The latter stage PLL circuit is characterized by performing synchronization in phase with the selected reference signal.

The clock generation circuit is characterized by further including a plurality of phase control circuits respectively provided for each of the outputs from the plurality of former stage PLL circuits, and controlling a phase control circuit corresponding to the selected reference signal such that the phase of a signal obtained by dividing the generated clock matches the phase of the selected reference signal.

The plurality of phase control circuits are characterized by matching the phase of an output from another one of the plurality of former stage PLL circuits with the phase of an output from one of the plurality of former stage PLL circuits corresponding to the selected reference signal.

The clock generation circuit is characterized by controlling the phase control circuit in commensurate with a cycle of the selected reference signal.

The clock generation circuit is characterized by controlling the phase control circuit in commensurate with a dividing cycle of the generated clock.

BRIEF DESCRIPTION OF THE DRAWINGS

FIG. 10 shows a wave form of each element of the conventional art clock generation circuit.

BEST MODE FOR CARRYING OUT THE INVENTION

Figure 1:
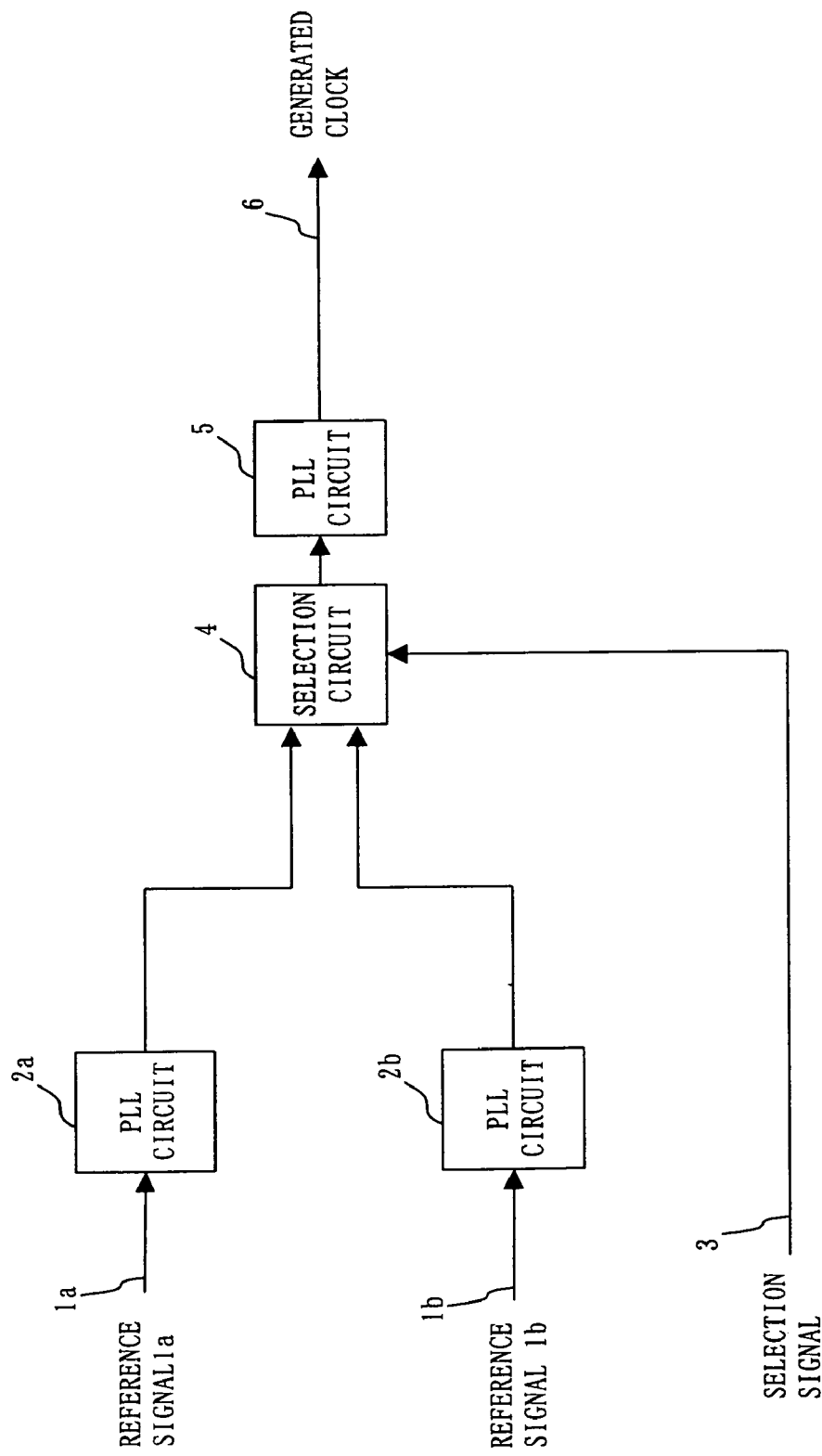
FIG. 1 is a block diagram of a clock generation circuit according to a first embodiment.

Embodiment 1.

Hereinafter, a first embodiment is discussed with reference to FIG. 1. With referring to FIG. 1, a reference numeral 1 denotes a reference signal, a reference numeral 2 denotes a PLL circuit, a reference numeral 3 denotes a selection signal, a reference numeral 4 denotes a selection circuit, a reference numeral 5 denotes a PLL circuit, and a reference numeral 6 denotes a generated clock. FIG. 2 shows the waveform of each element in FIG. 1.

Figure 2:
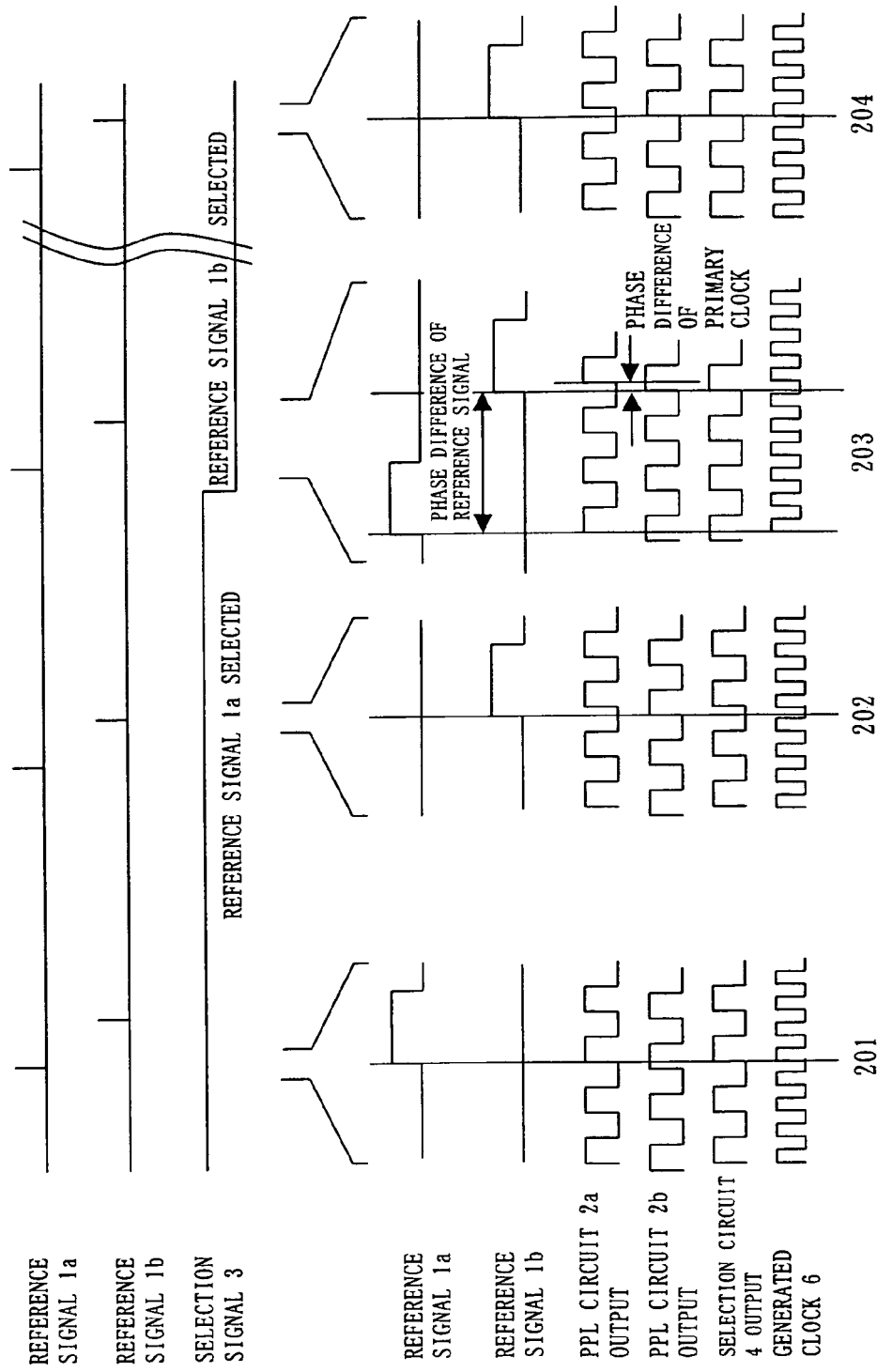
FIG. 2 shows a waveform of each element of the clock generation circuit according to the first embodiment.

As shown in FIG. 1, the reference signals 1 are inputted, respectively, to the PLL circuits 2. More specifically, a reference signal 1a is inputted to a PLL circuit 2a, and a reference signal 1b is inputted to a PLL circuit 2b. The PLL circuits 2a and 2b output primary clocks that are synchronized, respectively, with the reference signals 1a and 1b inputted.

Then, the selection circuit 4 selects one of the primary clocks that are synchronized with the reference signals outputted from the PLL circuits 2, respectively, based on the selection signal 3. A selected primary clock is inputted to the PLL circuit 5 provided in the next stage The PLL circuit 5 outputs the generated clock 6 that is synchronized with the selected primary clock.

Reference numerals 201 and 202 in FIG. 2 each show the waveform of each element in the case where the reference signal 1a is selected based on the selection signal 3. At 201 in FIG. 2, it is illustrated that an output from the PLL circuit 2a is synchronized with the reference signal 1a, an output from the PLL circuit 2b is synchronized with the reference signal 1b, and the reference signal 1a is selected in the selection circuit 4 based on the selection signal 3. Consequently, the phase of the generated clock 6 is synchronized with the phase of the reference signal 1a. At 202 in FIG. 2, it is illustrated that the reference signal 1a is selected based on the selection signal 3 in the selection circuit 4. Therefore, the phase of the generated clock 6 is not synchronized with the phase of the reference signal 1b.

With 203 in FIG. 2, it shows the waveform of each element just after the reference signal was changed to the reference signal 1b in the selection circuit 4 based on the selection signal 3. With this state, the output of the selection circuit 4 is synchronized with the reference signal 1b, but the PLL circuit is in a transient state to synchronization with the reference signal 1b just changed, and the generated clock 6 is not synchronized with the reference signal 1b yet.

At 204 in FIG. 2, the waveform of each element in steady state is shown with time. The phase of the generated clock 6 is synchronized with the phase of the reference signal 1b selected in the selection circuit 4 based on the selection signal 3.

According to the first embodiment, the PLL circuits 2 are provided for the reference signals 1, respectively, and generate the primary clocks that are synchronized with the respective reference signals 1. Then, one of the primary clocks is selected and inputted to the PLL circuit 5 in the next stage to obtain the generated clock 6. With the conventional art, upon change of the reference signal 1 based on the selection signal 3, phase difference between the reference signals 1 before and after the change is inputted directly to the PLL circuit 5 generating the clock. According to this embodiment, however, phase difference between the primary clocks before and after the change, which are outputted from the PLL circuits 2, is inputted to the PLL circuit 5 generating the clock. As shown in FIG. 2, to generate a more high-speed primary clock than the reference signal 1 makes it possible to reduce the phase difference inputted to the PLL circuit 5 greatly upon change of the reference signal 1. This results in allowing the phase fluctuation of the generated clock 6 that is outputted from the PLL circuit 5 to be reduced greatly. Hence, stable clocks may be provided in a system.

The PLL circuits 2 are thus provided for the reference signals 1, respectively. This further contributes to eliminating phase jitter with the input signal in each PLL circuit 2 upon change of the input signal. Accordingly, with respect to the problem of the setup of loop gain in the PLL circuit, which is trade-off with the transient response by the phase jitter of the input signal, in the conventional art, the present invention allows high loop gain setting in the PLL circuit 2. This can eliminate the phase control that is essential in the conventional art. Likewise, in the PLL circuit 5, the phase jitter of the input signal is greatly reduced, so that high loop gain may be obtained, thus eliminating phase control.

The phase jitter of the input signal thus greatly reduced in both the PLL circuit 2 and the PLL circuit 5 contributes not only to allowing high loop gain setting, but also to allowing a reduction in the precision of transient response control. Consequently, it becomes possible to integrate the voltage control oscillator 25 or the low-pass filter 22, thus allowing apparatuses to be downsized and energy consumption to be lowered.

According to the first embodiment, two types of the reference signals 1 are inputted, as an example. The present invention is applicable to another case in which more than two types of the reference signals 1 are to be inputted. Furthermore, two stages of the PLL circuits are linked in sequence here as an example. It is also applicable, other than this example, that more than two stages of the PLL circuits are linked in sequence.

Embodiment 2.

Figure 3:
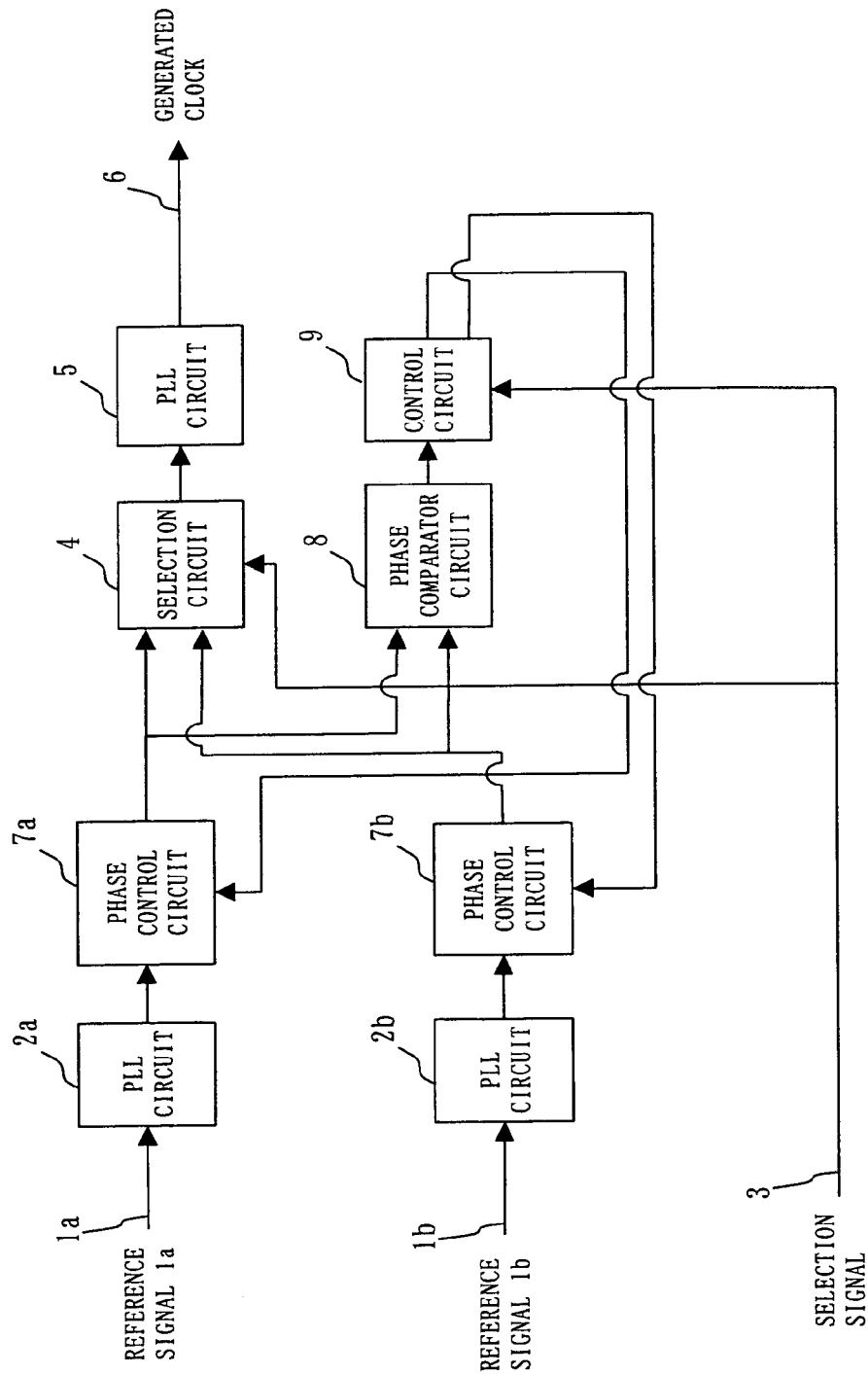
FIG. 3 is a block diagram of a clock generation circuit according to a second embodiment.

A second embodiment is now discussed with reference to the drawings. With referring to FIG. 3, a reference numeral 1 denotes a reference signal, a reference numeral 2 denotes a PLL circuit (former stage), a reference numeral 3 denotes a selection signal, a reference numeral 4 denotes a selection circuit, a reference numeral 5 denotes a PLL circuit (latter stage), a reference numeral 6 denotes a generated clock, a reference numeral 7 denotes a phase control circuit, a reference numeral 8 denotes a phase comparator circuit, and a reference numeral 9 denotes a control circuit.

According to the second embodiment, the phase control circuits 7 are provided, respectively, at the outputs of the PLL circuits 2 receiving the reference signals 1, so that the phase of the primary clock outputted from the phase control circuit 7 through the PLL circuit 2 corresponding to the reference signal 1 selected in the selection circuit 4 based on the selection signal 3 and the phase of the primary clock outputted from the phase control circuit 7 through the PLL circuit 2 corresponding to the other reference signal 1 match. The phase of the primary clock that is selected and the phase of the other primary clock are compared in the phase comparator circuit 8. The control circuit 9 controls the phase control circuit that outputs the primary clock that is not selected so that the phases of the both primary clocks match.

Thus, the phase of the primary clock that is not selected is controlled to match the phase of the primary clock that is selected. Consequently, no phase jitter occurs in the input signal that is inputted to the PLL circuit 5 upon change in the selection circuit 4 based on the selection signal 3. This may provide more stable clocks, in addition to the benefits of integration and elimination of control that are discussed in the first embodiment Embodiment 3.

According to a third embodiment, the phase control circuit 7 discussed in the second embodiment is implemented by a ring counter and a selection circuit.

Figure 4:
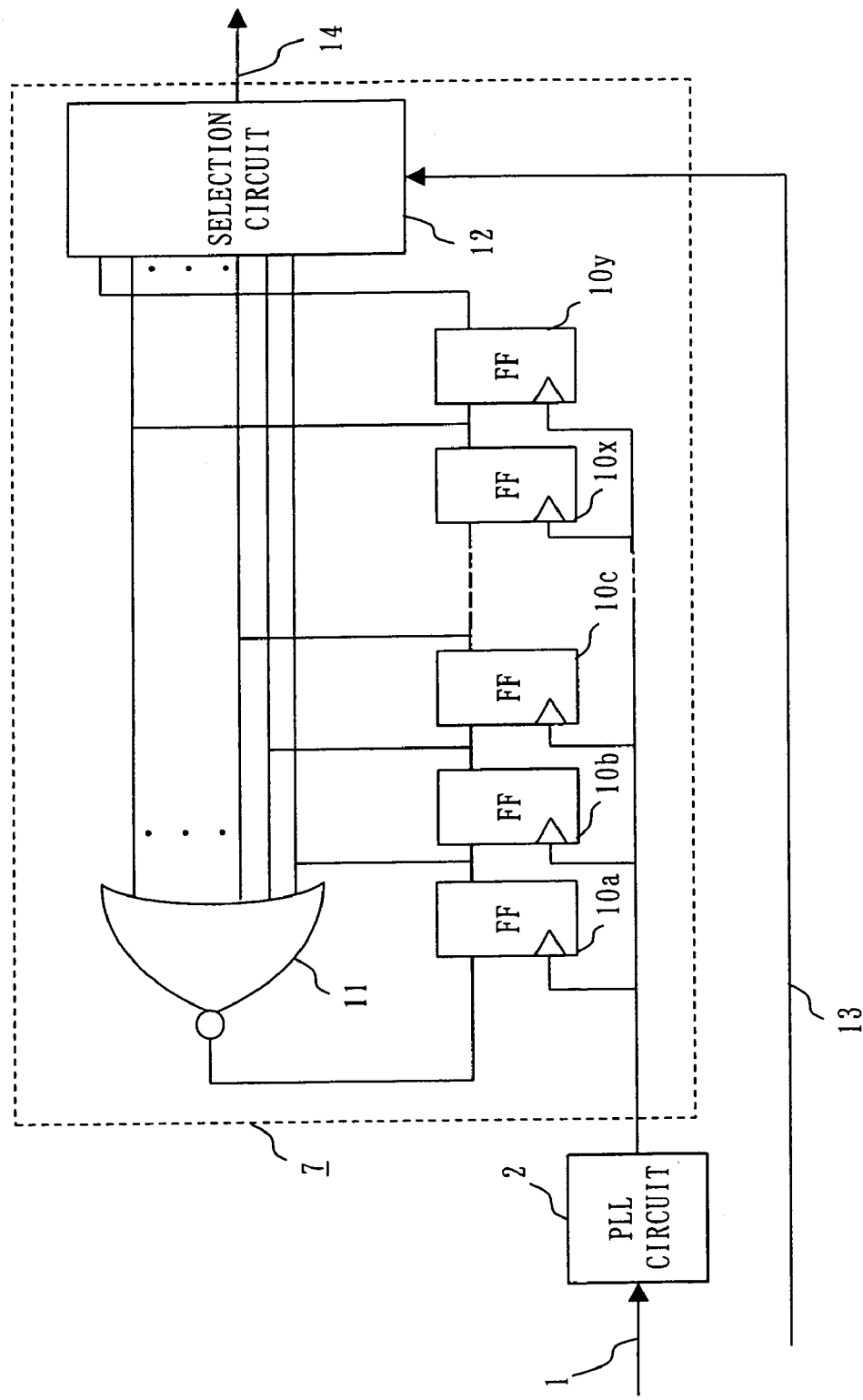
FIG. 4 is a block diagram of a phase control circuit according to a third embodiment.
Figure 5:
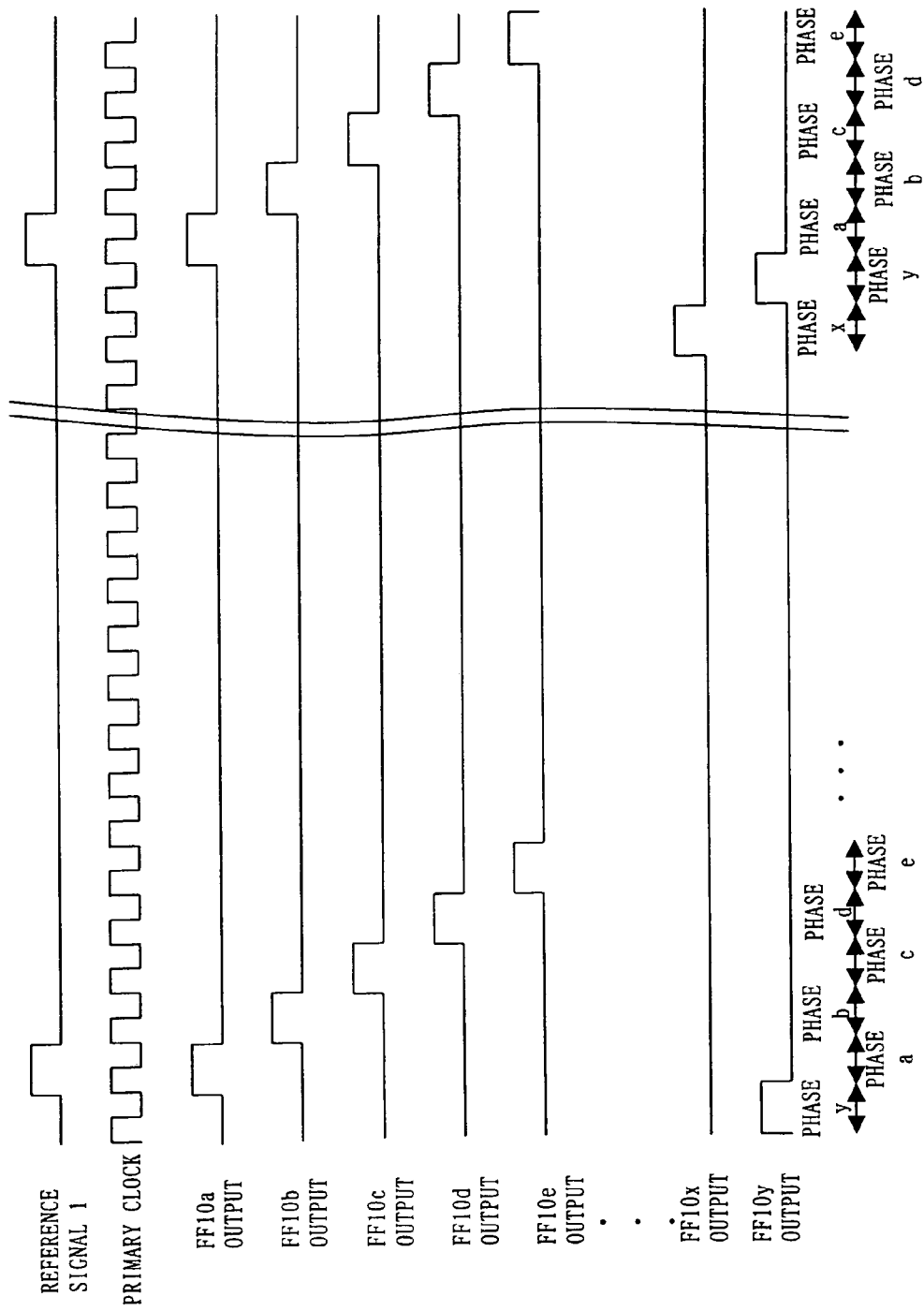
FIG. 5 shows a waveform of each element of the phase control circuit according to the third embodiment.

With referring to FIG. 4, a reference numeral 1 denotes a reference signal, a reference numeral 2 denotes a PLL circuit (former stage), a reference numeral 7 denotes a phase control circuit, a reference numeral 10 denotes flip-flops, a reference numeral 11 denotes a NOR circuit, a reference numeral 12 denotes a selection circuit, a reference numeral 13 denotes a control signal, and a reference numeral 14 denotes an output of the phase control circuit. FIG. 5 shows the waveform of each element in FIG. 4.

The primary clock outputted from the PLL circuit 2 operates a ring counter that is configured with flip-flops 10 and the NOR circuit 11. As shown in FIG. 5, outputs from a flip-flop 10a~a flip-flop 10y are multi-phase signals depending upon the number of the stages in the ring counter. Selecting one of the multi-phase signals by using the selection circuit 12, configures the phase control circuit 7. The outputs from the flip-flop 10a~the flip-flop 10y are cyclic. In the phase control operation, if it is needed to control phase to delay further while the output of the flip-flop 10y is selected by the selection circuit 12, the output of the flip-flop 10a is to be selected by the selection circuit 12. As a phase control method for increasing or decreasing phase slightly and serially, the outputs of the flip-flops 10 which is selected by the selection circuit 12, is to be selected by cyclically. This can make the range of phase control infinite in the phase control circuit 7.

The number of the flip-flops 10 making up the ring counter in the phase control circuit 7 is determined in combination with the speed of the primary clock outputted from the PLL circuit 2. More specifically, the number of stages of the flip-flops 10 is determined as resolution that is necessary for phase control so that no phase jitter occurs in the generated clock 6 that is outputted from the PLL circuit 5 upon change in the selection circuit 4.

The phase control circuit 7 thus configured allows the range of phase control to become infinite, thus allowing control resolution for phase control to be set freely.

Embodiment 4.

According to a fourth embodiment, frequency-synchronization is carried out with the reference signals in the PLL circuits 2 provided for the respective reference signals 1 as discussed in the first embodiment, one of the frequency-synchronized signals is selected in the selection circuit 4, the selected signal is then inputted to the PLL circuit 5 in the next stage, and phase-synchronization is carried out with the selected reference signal 1 in the PLL circuit 5 in the next stage.

Figure 6:
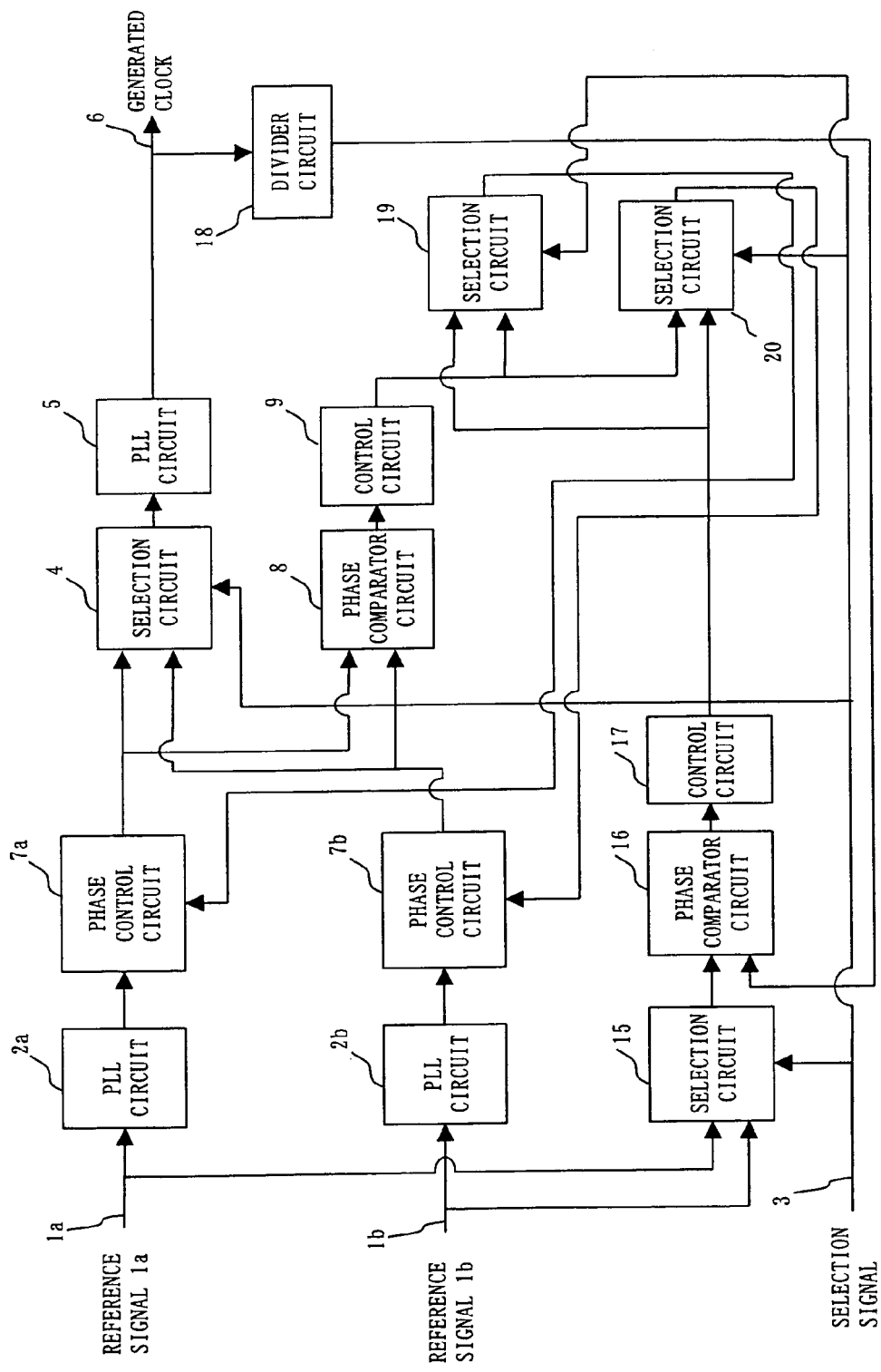
FIG. 6 is a block diagram of a clock generation circuit according to a fourth embodiment.

With referring to FIG. 6, a reference numeral 1 denotes a reference signal, a reference numeral 2 denotes a PLL circuit (former stage), a reference numeral 3 denotes a selection signal, a reference numeral 4 denotes a selection circuit, a reference numeral 5 denotes a PLL circuit (latter stage), a reference numeral 6 denotes a generated clock, a reference numeral 7 denotes a phase control circuit, a reference numeral 8 denotes a phase comparator circuit, a reference numeral 9 denotes a control circuit, a reference numeral 15 denotes a selection circuit, a reference numeral 16 denotes a phase comparator circuit, a reference numeral 17 denotes a control circuit, a reference numeral 18 denotes a divider circuit, a reference numeral 19 denotes a selection circuit, and a reference numeral 20 denotes a selection circuit.

Incoming reference signals 1 are inputted, respectively, to the PLL circuits 2. The PLL circuits 2 output the primary clocks that are synchronized in frequency with the respective reference signals 1 inputted. The primary clocks are inputted to the selection circuit 4 through the respective phase control circuits 7. Then, one of the inputted primary clocks is selected based on the selection signal 3 and fed into the PLL circuit 5. Then, the generated clock 6 is outputted from the PLL circuit 5.

The reference signals 1 are also inputted to the selection circuit 15, and one of the reference signals 1 is selected based on the selection signal 3. The selection circuit 15 and the selection circuit 4 select the same type of reference signal 1 and synchronized primary clock in frequency. The phase comparator circuit 16 compares the phase of the reference signal 1 selected in the selection circuit 15 and the phase of a signal obtained by dividing the generated clock 6 through the divider circuit 18. A result of phase comparison is inputted to the control circuit 17 and used to control the phase control circuit 7 corresponding to the selected reference signal 1. The phase control circuit 7 matches the phase of the reference signal 1 and the phase of the divided signal outputted from the divider circuit 18.

The phase comparator circuit 8 compares the phase of the primary clock outputted from the PLL circuit 2 receiving the selected reference signal 1 and the phase of the primary clock outputted from the PLL circuit 2 receiving the other reference signal 1. A result of phase comparison is inputted to the control circuit 9 and used to control the phase control circuit 7 corresponding to the selected reference signal 1. The phase control circuit 7 matches the phase of the primary clock corresponding to the selected reference signal 1 and the phase of the primary clock corresponding to the other reference signal 1. The selection circuit 19 and the selection circuit 20 select the control of the phase control circuit 7 corresponding to the selected reference signal 1 and the control of the phase control circuit 7 corresponding to the other reference signal 1, respectively, based on the selection signal 3.

Thus, the PLL circuit 2 in the first stage carries out frequency-synchronization with the reference signal 1, and the PLL circuit 5 in the next stage carries out phase-synchronization with the selected reference signal 1. This not only allows providing the system with the generated clock 6 whose frequency is synchronized with the selected reference signal 1 but also allows reproducing the phase that matches the selected reference signal 1. This is applicable to frame phase signal, for example. Furthermore, the phase of the primary clock corresponding to the selected reference signal 1 matches the phase of the primary clock corresponding to the other reference signal 1. This causes no phase jitter in the signal inputted to the PLL circuit 5 upon change of the reference signal 1 in the selection circuit 4 based on the selection signal 3. Hence, stable clocks may be provided.

Embodiment 5.

According to a fifth embodiment, the control circuit 17 and the control circuit 9 for controlling the phase control circuits 7 of the fourth embodiment are controlled in commensurate with the cycle of the selected reference signal 1.

Figure 7:
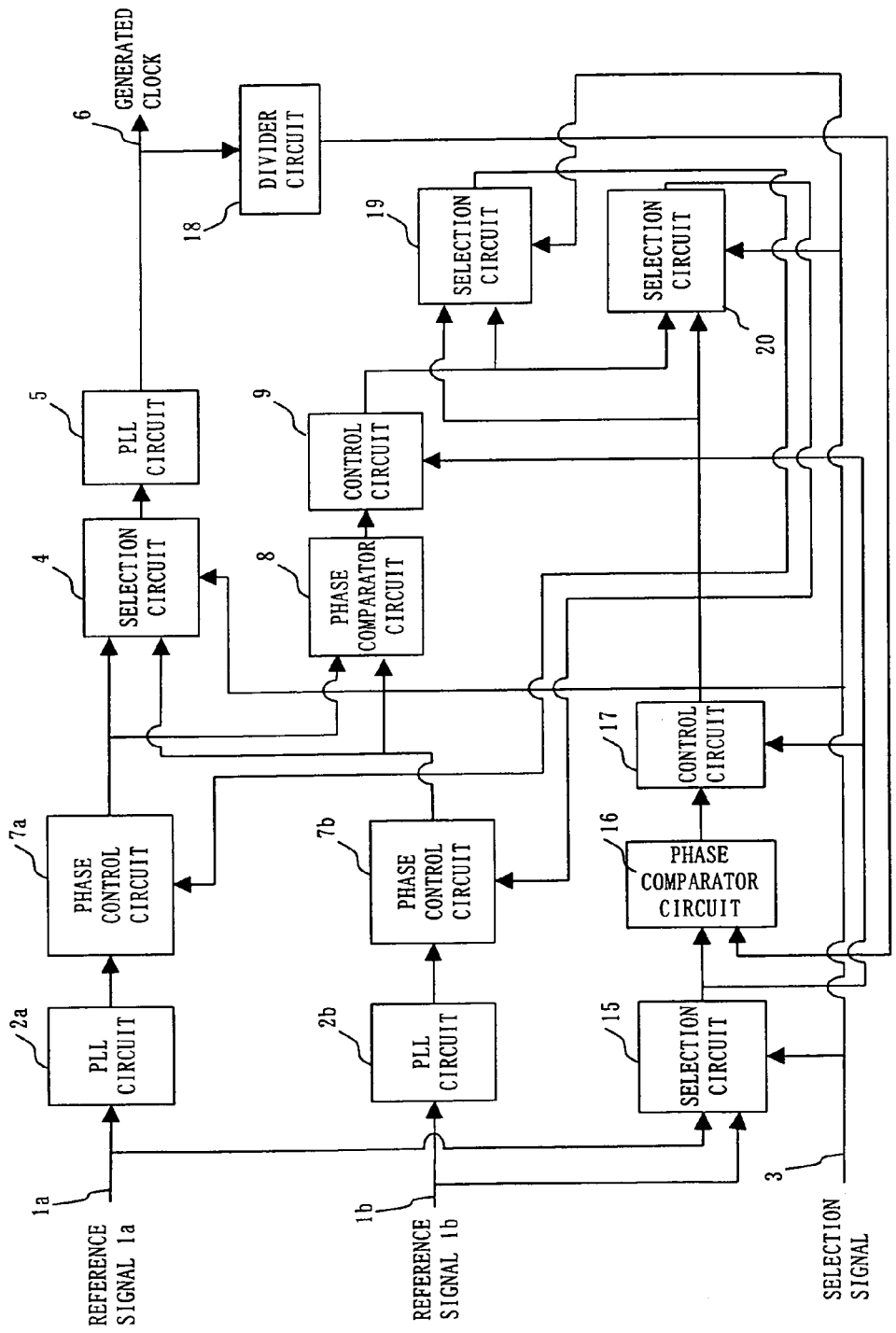
FIG. 7 is a block diagram of a clock generation circuit according to a fifth embodiment.

With referring to FIG. 7, a reference numeral 1 denotes a reference signal, a reference numeral 2 denotes a PLL circuit (former stage), a reference numeral 3 denotes a selection signal, a reference numeral 4 denotes a selection circuit, a reference numeral 5 denotes a PLL circuit (latter stage), a reference numeral 6 denotes a generated clock, a reference numeral 7 denotes a phase control circuit, a reference numeral 8 denotes a phase comparator circuit, a reference numeral 9 denotes a control circuit, a reference numeral 15 denotes a selection circuit, a reference numeral 16 denotes a phase comparator circuit, a reference numeral 17 denotes a control circuit, a reference numeral 18 denotes a divider circuit, a reference numeral 19 denotes a selection circuit, and a reference numeral 20 denotes a selection circuit.

Control cycle determines the transient response upon change of the reference signal 1 to be selected based on the selection signal 3. Compared to the conventional art in which the transient response is controlled based on the frequency characteristic of the low-pass filter, high precision control is allowed according to the fifth embodiment. Furthermore, the possibility of the frequency response of the low-pass filter restricts the design flexibility of the transient response upon change of the reference signal 1 according to the conventional art. According to the fifth embodiment, however, the control is based on logic circuit processing, and therefore there is the advantage of high design flexibility.

Embodiment 6.

According to a sixth embodiment, the control circuit 17 and the control circuit 9 for controlling the phase control circuits 7 of the fourth embodiment are controlled in commensurate with the cycle of a signal obtained by dividing the generated clock 6 in the divider circuit 18.

Figure 8:
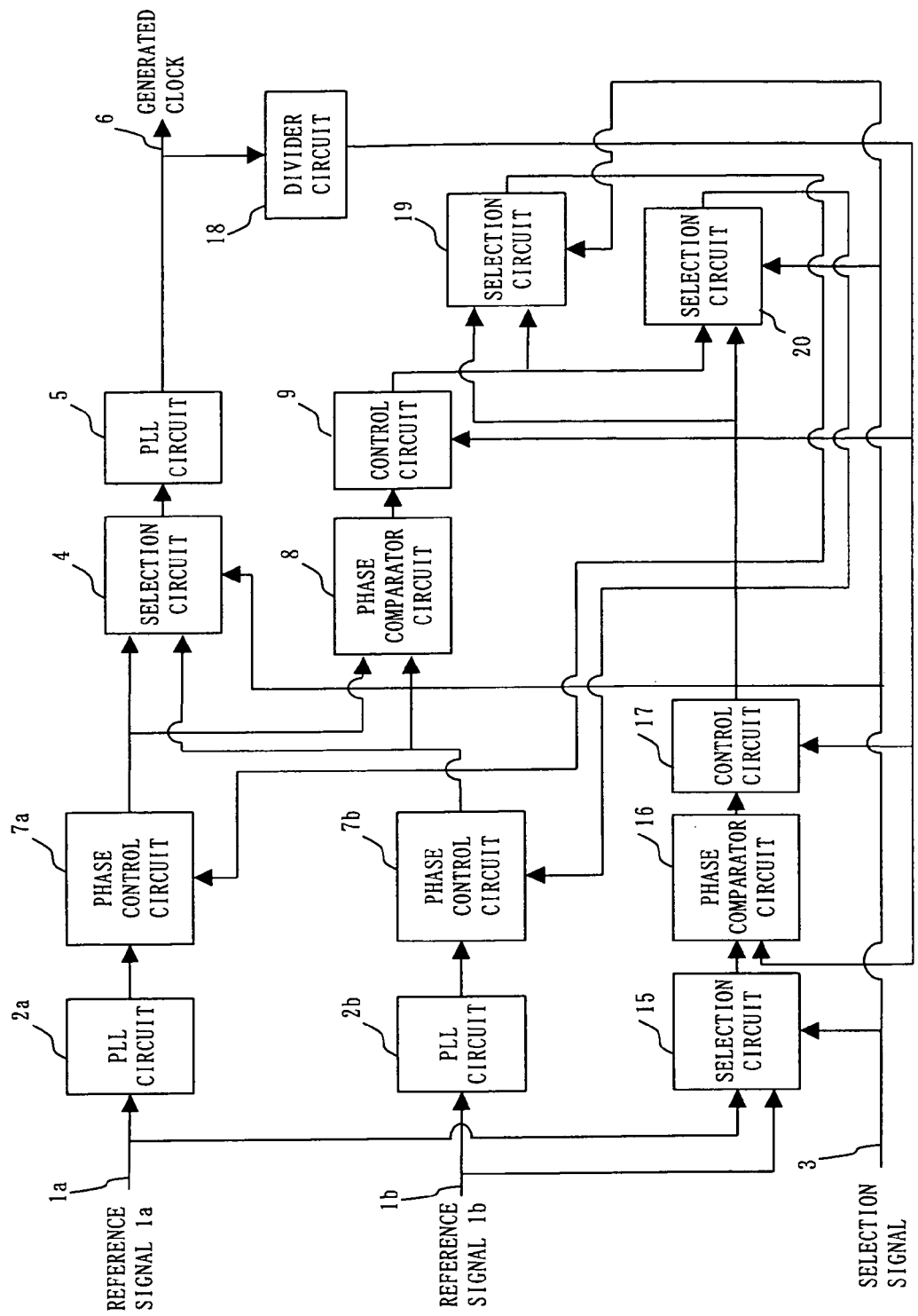
FIG. 8 is a block diagram of a clock generation circuit according to a sixth embodiment.
Figure 9:
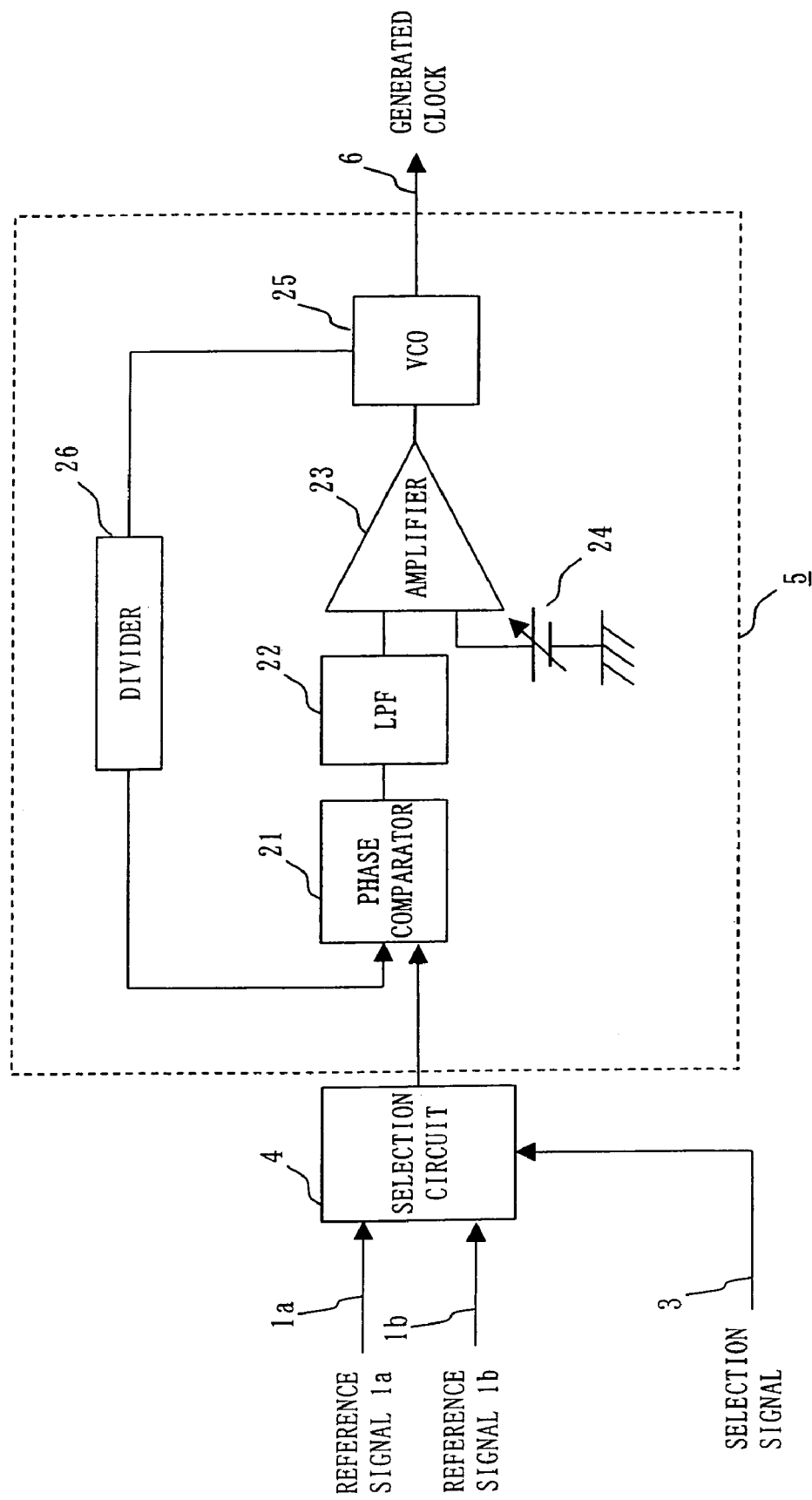
FIG. 9 is a block diagram of a conventional art clock generation circuit.

With referring to FIG. 8, a reference numeral 1 denotes a reference signal, a reference numeral 2 denotes a PLL circuit (former stage), a reference numeral 3 denotes a selection signal, a reference numeral 4 denotes a selection circuit, a reference numeral 5 denotes a PLL circuit (latter stage), a reference numeral 6 denotes a generated clock, a reference numeral 7 denotes a phase control circuit, a reference numeral 8 denotes a phase comparator circuit, a reference numeral 9 denotes a control circuit, a reference numeral 15 denotes a selection circuit, a reference numeral 16 denotes a phase comparator circuit, a reference numeral 17 denotes a control circuit, a reference numeral 18 denotes a divider circuit, a reference numeral 19 denotes a selection circuit, and a reference numeral 20 denotes a selection circuit.

Control cycle determines the transient response upon change of the reference signal 1 to be selected based on the selection signal 3. Compared to the conventional art in which the transient response is controlled based on the frequency characteristic of the low-pass filter, high precision control is allowed according to the sixth embodiment. Furthermore, the possibility of the frequency response of the low-pass filter restricts the design flexibility of the transient response upon change of the reference signal 1 according to the conventional art. According to the sixth embodiment, however, the control is based on logic circuit processing, and therefore there is the advantage of high design flexibility.

As aforementioned, the clock generation circuit according to this invention is thus configured with the multiple stages of the PLL circuits, which are linked in sequence, such that the PLL circuits are provided for incoming reference signals, respectively, and one of the outputs of the PLL circuits receiving the respective reference signals is selected to be fed to the PLL circuit in the next stage. In addition, the phase control circuits are thus provided at the outputs of the PLL circuits provided for the respective reference signals, so that the phase of the output of the PLL circuit receiving the selected reference signal and the phase of the output of the PLL circuit receiving the other reference signal match through the phase control circuit. The phase control circuit is configured with the ring counter and the selection circuit selecting one of the multiphase outputs of the ring counter. Furthermore, frequency-synchronization with the reference signal is carried out in the PLL circuits provided for receiving the respective reference signals, one of the frequency-synchronized signals is selected, and the selected signal is synchronized in phase with the reference signal in the PLL circuit in the next stage. Thus, the phase control circuits are controlled in commensurate with the cycle of the reference signal or the generated clock signal.

INDUSTRIAL APPLICABILITY

Generating the more high-speed primary clock than the reference signal 1 makes it possible to greatly reduce the phase difference received by the PLL circuit 5 upon change of the reference signal 1. Consequently, this allows the phase fluctuation of the generated clock 6 that is outputted from the PLL circuit 5 to be greatly reduced. Hence, stable clocks may be provided in a system.

Furthermore, the configuration of PLL circuits 2 provided respectively for the reference signals 1 allows no phase jitter of the input signal upon change in the PLL circuit 2. With respect to the problem of the loop gain setup of the PLL circuit which is in the trade-off relation with the transient response caused by the phase jitter of the input signal, according to the conventional art, the loop gain of the PLL circuit 2 is allowed to be set high according to this invention. This can eliminate the phase control that is indispensable in the conventional art. Likewise, in the PLL circuit 5, since the phase jitter of the input signal is reduced greatly, high loop gain may be obtained, hence, the phase control may be eliminated.

The great reduction of the phase jitter of the input signal in both the PLL circuits 2 and the PLL circuit 5 not only allows the loop gain to be set high, but also allows the accuracy of transient response control to be reduced. Consequently, it becomes possible to integrate the voltage control oscillator 25 and the low-pass filter 22, thus allowing apparatuses to be downsized and power consumption to be lowered.

The phase of the primary clock that is not selected is controlled to match the phase of the primary clock that is selected. Consequently, no phase jitter occurs in the input signal that is inputted to the PLL circuit 5 upon change in the selection circuit 4 based on the selection signal 3. This may provide more stable clocks, in addition to the benefits of integration and elimination of control that are discussed in the first embodiment The phase control circuit 7 thus configured allows the range of phase control to become infinite, thus allowing control resolution for phase control to be set freely.

The PLL circuit 2 in the first stage carries out frequency-synchronization with the reference signal 1, and the PLL circuit 5 in the next stage carries out phase-synchronization with the selected reference signal 1. This not only allows providing the system with the generated clock 6 whose frequency is synchronized with the selected reference signal 1 but also allows reproducing the phase that matches the selected reference signal 1. This is applicable to frame phase signal, for example. Furthermore, the phase of the primary clock corresponding to the selected reference signal 1 matches the phase of the primary clock corresponding to the other reference signal 1. This causes no phase jitter in the signal inputted to the PLL circuit 5 upon change of the reference signal 1 in the selection circuit 4 based on the clock selection signal 3. Hence, stable clocks may be provided.

Compared to the conventional art in which the transient response is controlled based on the frequency characteristic of the low-pass filter, high precision control is allowed according to the fifth embodiment. Furthermore, the possibility of the frequency response of the low-pass filter restricts the design flexibility of the transient response upon change of the reference signal 1 according to the conventional art. According to the fifth embodiment, however, the control is based on logic circuit processing, and therefore there is the advantage of high design flexibility. Compared to the conventional art in which the transient response is controlled based on the frequency characteristic of the low-pass filter, high precision control is allowed according to the sixth embodiment. Furthermore, the possibility of the frequency response of the low-pass filter restricts the design flexibility of the transient response upon change of the reference signal 1 according to the conventional art. According to the sixth embodiment, however, the control is based on logic circuit processing, and therefore there is the advantage of high design flexibility.

The invention claimed is:

1. A clock generation circuit comprising:
   a plurality of former stage PLL circuits configured to receive a reference signal and to generate an output synchronized to the received reference signal;
   a plurality of phase control circuits each configured to match a phase of an output from a former stage PLL circuit in the plurality of former stage PLL circuits to a phase of an output from another former stage PLL, and generate a phase matched output;
   a phase detector configured to compare said phase matched outputs to generate a control signal to said phase control circuits;
   a selection circuit configured to select one of the phase matched outputs from the plurality of former stage PLL circuits; and
   a latter stage PLL circuit linked in sequence to the plurality of former stage PLL circuits, and configured to receive the selected output and generate a clock that is synchronized with the selected phase matched output.

2. The clock generation circuit according to claim 1, wherein the phase control circuits each include a ring counter and a selection circuit configured to select a multiphase output from the ring counter.

3. The clock generation circuit according to claim 1, wherein each former stage PLL circuit performs synchronization in frequency with the received reference signal, and
   wherein the latter stage PLL circuit performs synchronization in phase with the selected reference signal,
   the clock generation circuit further comprising,
   a divider circuit configured to divide the generated clock and to output a divided signal,
   wherein the phase control circuit is further configured to match a phase of the divided signal to a phase of the selected reference signal.

4. The clock generation circuit according to claim 3, wherein the phase control circuit is controlled based on a cycle of the selected reference signal.

5. The clock generation circuit according to claim 3, wherein the phase control circuit is controlled based on a divided cycle of the generated clock.

6. A clock generation circuit which selects one of a plurality of reference signals and generates a clock that is synchronized with a selected reference signal, the clock generation circuit comprising:
   a plurality of former stage PLL circuits respectively provided for each of the plurality of reference signals, generating outputs that are respectively synchronized with a corresponding reference signal;
   a plurality of phase control circuits, respectively provided for each of the outputs from the plurality of former stage PLL circuits, for matching phase of an output from another one of the plurality of former stage PLL circuits with phase of an output from one of the plurality of former stage PLL circuits to generate matched outputs;

a phase detector configured to compare said phase matched outputs to generate a control signal to said phase control circuits;

a selection circuit selecting one of the phase matched outputs PLL circuits; and a latter stage PLL circuit linked in sequence to the plurality of former stage PLL circuits, for receiving the selected phase matched output and generating the clock.

7. The clock generation circuit according to claim 6, wherein the phase control circuits each include a ring counter and a selection circuit configured to select a multiphase output from the ring counter.

8. The clock generation circuit according to claim 6, wherein each former stage PLL circuit performs synchronization in frequency with the corresponding reference signal, and wherein the latter stage PLL circuit performs synchronization in phase with the selected reference signal, the clock generation circuit further comprising, a divider circuit configured to divide the generated clock and to output a divided signal, wherein the phase control circuit is further configured to match a phase of the divided signal to a phase of the selected reference signal.

9. The clock generation circuit according to claim 8, wherein the phase control circuit is controlled based on a cycle of the selected reference signal.

10. The clock generation circuit according to claim 8, wherein the phase control circuit is controlled based on a divided cycle of the generated clock.

* * * * *